（12) United States Patent
Jha et al.

(10) Patent No.: US 10,008,385 B1
(45) Date of Patent: Jun. 26, 2018

(54) ENLARGED SACRIFICIAL GATE CAPS FOR FORMING SELF-ALIGNED CONTACTS

(71) Applicant: GLOBALFOUNDRIES Inc., Grand Cayman (KY)

(72) Inventors: Ashish Kumar Jha, Saratoga Springs, NY (US); Haiting Wang, Clifton Park, NY (US); Chih-Chiang Chang, Clifton Park, NY (US); Mitchell Rutkowski, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/612,335

(22) Filed: Jun. 2, 2017

(51) Int. Cl.
*H01L 21/28* (2006.01)
*H01L 21/768* (2006.01)

(52) U.S. Cl.
CPC .. *H01L 21/28132* (2013.01); *H01L 21/76805* (2013.01); *H01L 21/76897* (2013.01)

(58) Field of Classification Search
None
See application file for complete search history.

(56) References Cited

U.S. PATENT DOCUMENTS

| | | | |
|---|---|---|---|
| 8,741,723 B2 | 6/2014 | Chi | |
| 8,765,590 B2 | 7/2014 | Cheng et al. | |
| 8,772,168 B2 | 7/2014 | Xie et al. | |
| 9,076,816 B2 | 7/2015 | Zhang et al. | |
| 9,257,529 B2 | 2/2016 | Metz | |
| 9,443,944 B2 | 9/2016 | Zang et al. | |
| 2014/0264487 A1* | 9/2014 | Pham | H01L 29/78 257/288 |

* cited by examiner

*Primary Examiner* — Asok K Sarkar
(74) *Attorney, Agent, or Firm* — Thompson Hine LLP; Francois Pagette

(57) ABSTRACT

Methods of forming a sacrificial gate cap and a self-aligned contact for a device structure. A gate electrode is arranged between a first sidewall spacer and a second sidewall spacer. A top surface of the gate electrode is recessed to open a space above the top surface of the recessed gate electrode that partially exposes the first and second sidewall spacers. Respective sections of the first and second sidewall spacers, which are arranged above the top surface of the recessed gate electrode, are removed in order to increase a width of the space. A sacrificial cap is formed in the widened space.

19 Claims, 5 Drawing Sheets

US 10,008,385 B1

ENLARGED SACRIFICIAL GATE CAPS FOR FORMING SELF-ALIGNED CONTACTS

BACKGROUND

The present invention relates to semiconductor device fabrication and integrated circuits and, more specifically, to methods of forming a sacrificial gate cap and self-aligned contact for a device structure, such as a field-effect transistor.

Device structures for a field-effect transistor generally include a body region, a source and a drain defined in the body region, and a gate structure configured to apply a control voltage that switches carrier flow in a channel formed in the body region. When a control voltage that is greater than a designated threshold voltage is applied, carrier flow occurs in the channel between the source and drain to produce a device output current.

Contacts may provide vertical electrical connections to features of semiconductor devices, such as the gate structure and source/drain regions of a field-effect transistor. Self-aligned contacts (SAC) are formed in contact openings that are constrained during etching by the configuration of adjacent structures, e.g., sidewall spacers on adjacent gate structures, as opposed to being constrained by a patterned resist. For example, a self-aligned contact may be formed in a contact opening that is defined by selectively etching one material, e.g., silicon dioxide, of an interlayer dielectric layer relative to other materials, such as silicon nitride sidewall spacers on adjacent gate structures.

The contacts to the source/drain regions of a field-effect transistor should remain electrically insulated from the gate electrode of the gate structure in order to ensure the functionality of the field-effect transistor. Otherwise, a short circuit can occur that may damage the field-effect transistor. In a self-aligned contact process used to contact the source/drain regions, the contact opening can partially overlap with the gate structure. To reduce the risk of shorting arising from the partial overlap, the gate electrode is protected by a cap and sidewall spacers. As technology nodes advance, the space available between adjacent gate structures decreases with decreasing pitch. The decreased spacing increases the difficulty in contacting the source/drain regions without inflicting damage to the cap and sidewall spacers protecting the gate structures when forming contact openings.

Improved methods of forming a sacrificial gate cap and self-aligned contact for a device structure are needed.

SUMMARY

In an embodiment of the invention, a method includes forming a gate electrode arranged between a first sidewall spacer and a second sidewall spacer. The method further includes recessing a top surface of the gate electrode to open a space above the top surface of the recessed gate electrode that partially exposes the first and second sidewall spacers. A section of the first sidewall spacer and a section of the second sidewall spacer, which are arranged above the top surface of the recessed gate electrode, are removed in order to increase a width of the space. A sacrificial cap is formed in the widened space.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
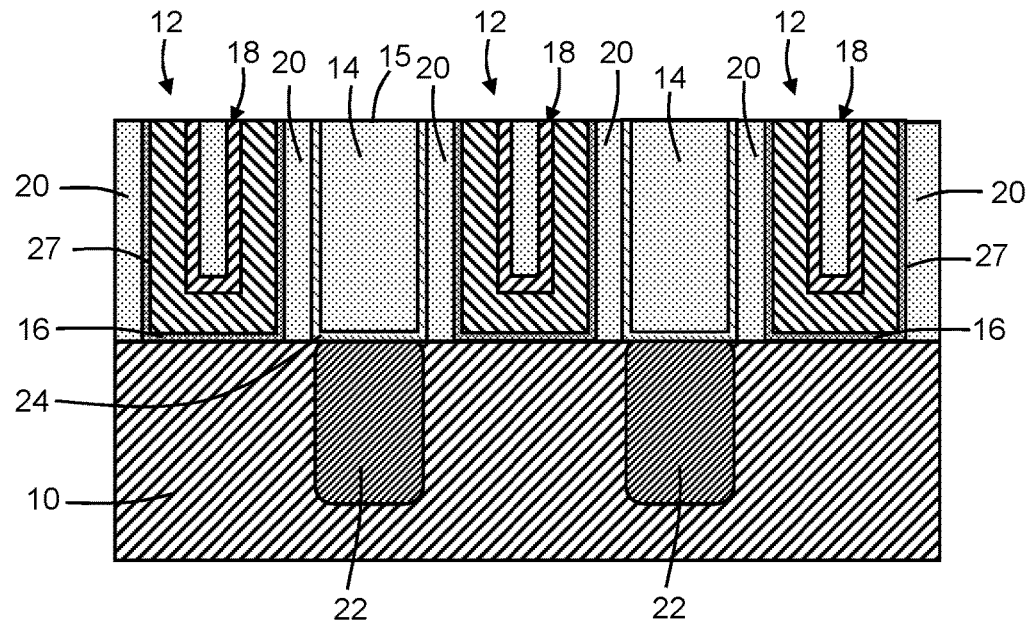
FIGS. 1-5 are cross-sectional views of a portion of a substrate at successive fabrication stages of a processing method for forming a structure in accordance with embodiments of the invention.

With reference to FIG. 1 and in accordance with embodiments of the invention, a substrate 10 is provided that may be a bulk substrate or a device layer of a semiconductor-on-insulator (SOI) substrate. Gate structures 12 are located on a top surface of the substrate 10. Sections of an interlayer dielectric layer 14 are located in the spaces between the gate structures 12. Each gate structure 12 includes a gate dielectric 16 and a gate electrode 18. The vertical sidewalls of the gate structures 12 are clad by sidewall spacers 20.

The interlayer dielectric layer 14 may be composed of a dielectric material, such as silicon dioxide ($SiO_2$). The gate dielectric 16 may be composed of a dielectric material, such as a high-k dielectric material like hafnium oxide ($HfO_2$) that has a dielectric constant (e.g., permittivity) higher than the dielectric constant of $SiO_2$, deposited by atomic layer deposition (ALD). The gate electrode 18 may include one or more conformal barrier metal layers and/or work function metal layers composed of conductors, such as metals (e.g., tungsten (W)) and/or metal nitrides or carbides (e.g., titanium nitride (TiN) and titanium aluminum carbide (TiAlC)), deposited by physical vapor deposition (PVD), chemical vapor deposition (CVD), etc. The barrier metal layers and/or work function metal layers of the gate electrode 18 may differ for an n-type field-effect transistor or a p-type field-effect transistor. The sidewall spacers 20 may be composed of a dielectric material, such as a low-k dielectric material like silicon oxycarbonitride (SiOCN), deposited as a conformal layer by ALD and etched with a directional etching process such as reactive ion etching (RIE).

The gate structures 12 may be formed by a replacement metal gate (RMG) technique in which the gate dielectric 16 and gate electrode 18 replace a sacrificial gate structure. In this instance, the gate structures 12 may be formed by depositing the conformal barrier metal layers and/or work function metal layers to fill a space between the sidewall spacers 20 opened by the removal of the sacrificial gate structure and removing the deposited layers from the field area on the interlayer dielectric layer 14 by planarization, such as with chemical-mechanical polishing (CMP). The planarization from the polishing causes the gate dielectric 16, the gate electrode 18, and the sidewall spacers 20 to be coplanar with a top surface 15 of the adjacent sections of the interlayer dielectric layer 14.

Source/drain regions 22 are arranged in the spaces between adjacent gate structures 12 at respective locations near the top surface of the substrate 10. As used herein, the term "source/drain region" means a doped region of semiconductor material that can function as either a source or a drain of a field-effect transistor. For an n-type field-effect transistor, the semiconductor material of the source/drain regions 22 may be doped with an n-type dopant from Group V of the Periodic Table (e.g., phosphorus (P) or arsenic (As)) that is effective to impart n-type conductivity. For a p-type field-effect transistor, the semiconductor material of the source/drain regions 22 may be doped with a p-type dopant selected from Group III of the Periodic Table (e.g., boron (B)) that is effective to impart p-type conductivity. The source/drain regions 22 may be formed by, for example, ion implantation.

The source/drain regions 22 are covered by a contact etch stop layer (CESL) 24, which may be constituted by a thin layer of silicon nitride ($Si_3N_4$). The CESL 24 may has sections that further extend vertically between the sidewall spacers 20 and the interlayer dielectric layer 14. Vertical seams 27 are located along the interfaces between the sidewall spacers 20 and CESL 24, as well as along the interfaces between the interlayer dielectric layer 14 and CESL 24.

The device structure that includes the gate structures 12 and source/drain regions 22 may be fabricated by complementary metal oxide semiconductor (CMOS) processes during front-end-of-line (FEOL) processing. The device structure may be, for example, a planar field-effect transistor or a fin-type field-effect transistor.

Figure 2:
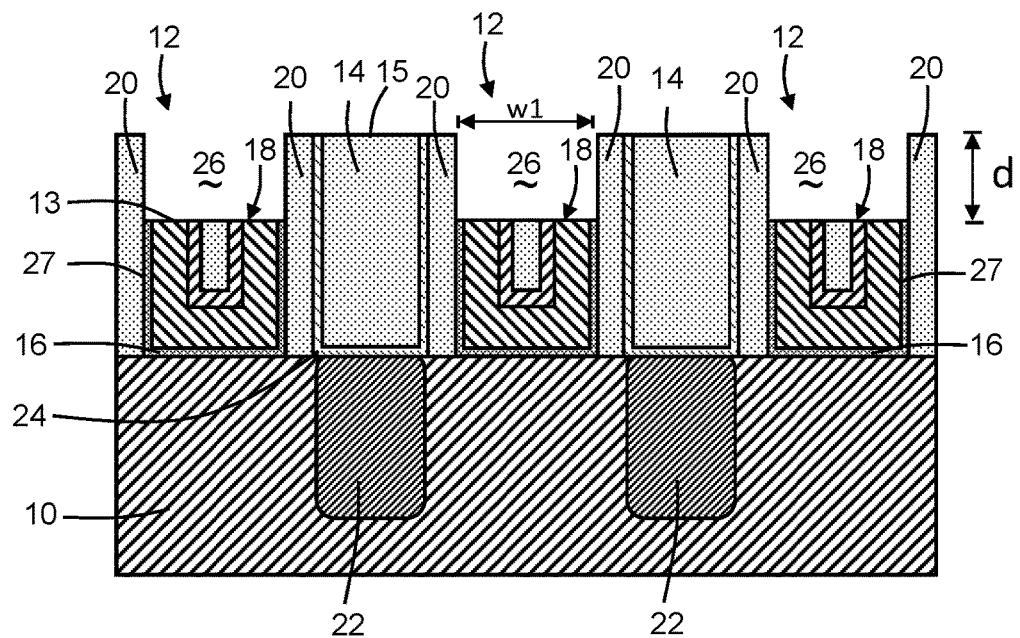

With reference to FIG. 2 in which like reference numerals refer to like features in FIG. 1 and at a subsequent fabrication stage of the processing method, the gate dielectric 16 and gate electrode 18 of the gate structures 12 are etched back and thereby recessed by a distance, d, relative to the top surface 15 of the interlayer dielectric layer 14, the sidewall spacers 20, and CESL 24. Spaces 26 are respectively opened above a top surface 13 of the gate structures 12. The spaces 26 have a width, w1, between the sidewall spacers 20. Respective sections of the sidewall spacers 20 and CESL 24 are located above the top surface 13 of the gate structures 12 and are exposed by the etch back of the gate structures 12.

Figure 3:
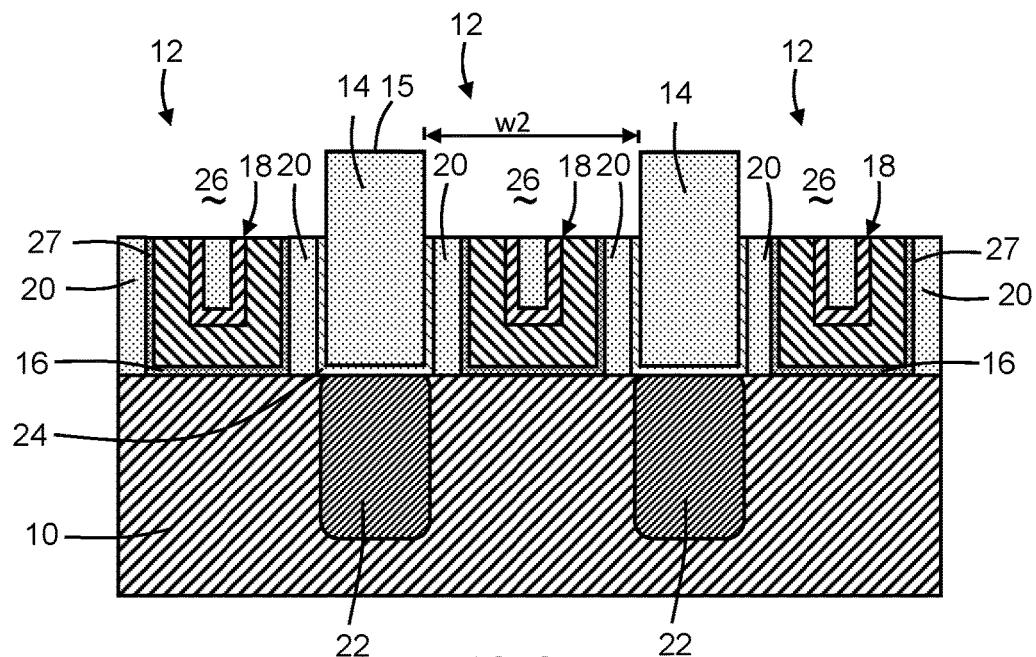

With reference to FIG. 3 in which like reference numerals refer to like features in FIG. 2 and at a subsequent fabrication stage of the processing method, the spaces 26 are widened to have a width, w2, that is greater than the width, w1 (FIG. 2), by removing the exposed sections of the sidewall spacers 20 and CESL 24 that are located above the top surface 13 of the gate structures 12. To that end, one or more etching processes, such as reactive ion etching (RIE), using one or more etch chemistries may be used to remove the exposed sections of the sidewall spacers 20 and CESL 24 selective to the interlayer dielectric layer 14. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The removal of the exposed sections of the sidewall spacers 20 and CESL 24 may be performed with etching processes characterized by a lateral etching component that is enhanced in comparison with the vertical etching component. After the width of the spaces 26 is increased, each widened space 26 is located between adjacent sections of the interlayer dielectric layer 14.

The lateral etching reduces or eliminates the height difference between the gate electrode 18 and the sidewall spacers 20, as well as the height difference between the gate electrode 18 and the vertical sections of the CESL 24. A height difference is created between the sidewall spacers 20 and the top surface 15 of the interlayer dielectric layer 14, as well as between the top surface 15 of the interlayer dielectric layer 14 and the vertical sections of the CESL 24. The increase in the width of the spaces 26 from the removal of the sections of the sidewall spacers 20 and CESL 24 reduces the aspect ratio of depth to width of the spaces 26.

In an alternative embodiment, only the exposed sections of the sidewall spacers 20 may be removed while leaving the exposed sections of the CESL 24 intact. In this instance, the material constituting the sidewall spacers 20 may be chosen to be removed selectively to the material constituting the CESL 24.

Figure 4:
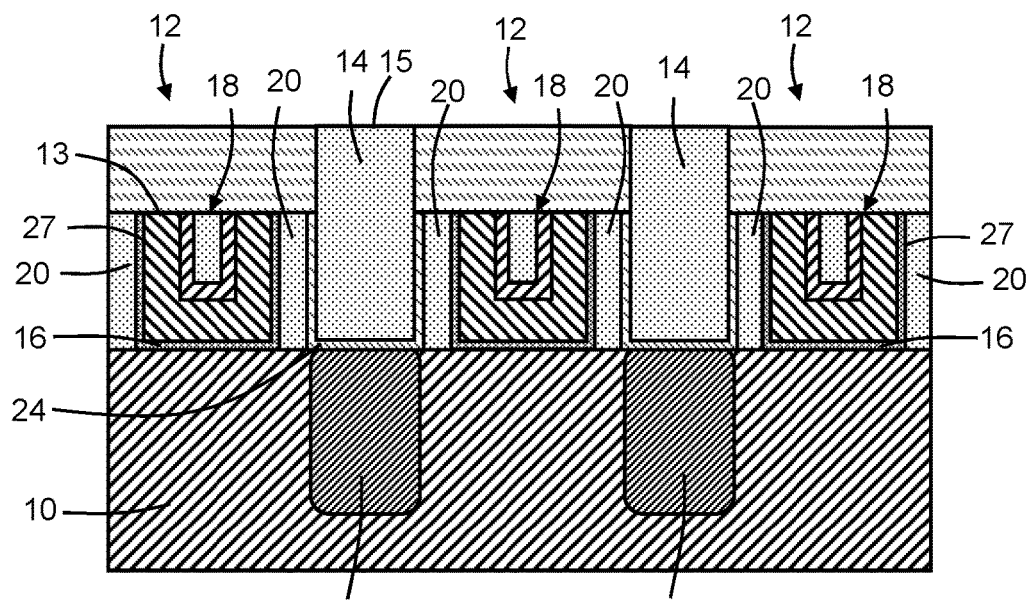

With reference to FIG. 4 in which like reference numerals refer to like features in FIG. 3 and at a subsequent fabrication stage of the processing method, a sacrificial cap 28 is formed on the respective top surface 13 of each recessed gate structure 12 as gap-fill material in the spaces 26. The sacrificial caps 28 may be comprised of a dielectric material, such as silicon nitride ($Si_3N_4$) or silicon oxycarbonitride (SiOCN), deposited by CVD. The material constituting the interlayer dielectric layer 14 may be chosen to etch selective to the constituent material of the sacrificial caps 28, as well as the material constituting the sidewall spacers 20. Each sacrificial cap 28 covers the top surface 13 of the gate structures 12, as well as overlaps with the sections of the sidewall spacers 20 and CESL 24 that are not removed when the spaces 26 are widened. Because sections of the sidewall spacers 20 and CESL 24 are removed before the sacrificial caps 28 are formed, the sacrificial caps 28 lack an interface at their side surfaces with the sidewall spacers 20. Instead, the sacrificial caps 28 have only horizontal interfaces with the top surfaces of the sidewall spacers 20 and CESL 24, and the sacrificial caps 28 cover the vertical seams 27. The sacrificial caps 28 have vertical interfaces with the adjacent sections of the interlayer dielectric layer 14.

The increased width of the spaces 26 may lower the likelihood that the sacrificial caps 28 are going to experience pinch-off during deposition. Conventional sacrificial caps formed in narrower spaces, such as those shown in FIG. 2 prior to widening, may be prone to pinch-off and the formation of internal voids during sacrificial cap deposition. The sacrificial caps 28 may be free of internal voids. The reduction in the aspect ratio, which is due to the removal of the sidewall spacers 20 and CESL 24, enables the reduced likelihood for pinch-off during the formation of the sacrificial caps 28.

Figure 5:
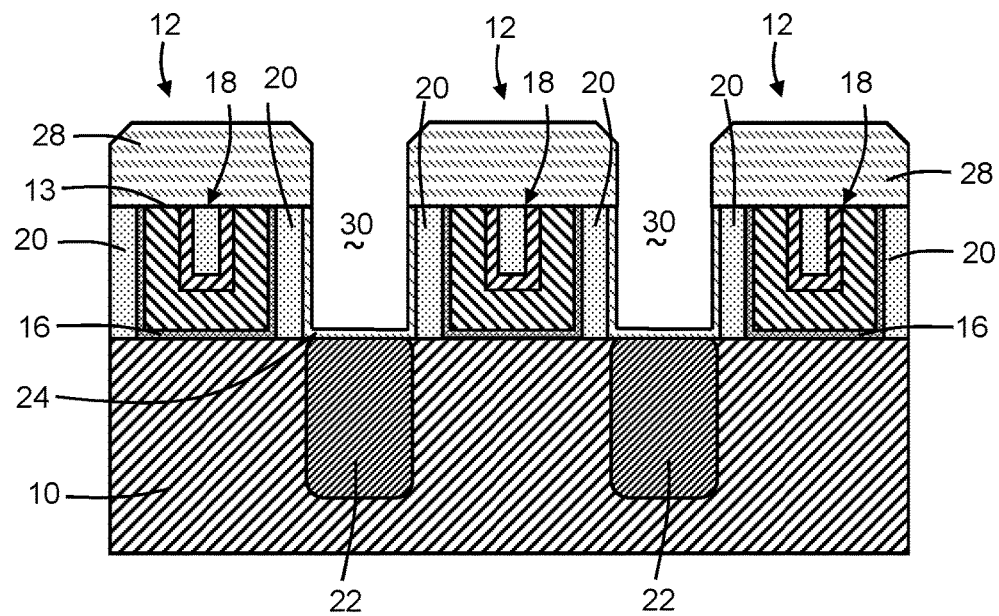

With reference to FIG. 5 in which like reference numerals refer to like features in FIG. 4 and at a subsequent fabrication stage of the processing method, self-aligned contact (SAC) etching is used to form contact openings 30 to the source/drain regions 22 by removing the sections of the interlayer dielectric layer 14 from the spaces between the gate structures 12. The interlayer dielectric layer 14 may be removed by an etching process, such as a reactive ion etching (RIE) process, with an etch chemistry that is selective to the dielectric materials constituting the sacrificial caps 28 and the CESL 24. The CESL 24 protects the top surface of the source/drain regions 22 and the sacrificial caps 28 protect the top surfaces 13 of the gate structures 12 against damage from the etchant used by the etching process to remove the interlayer dielectric layer 14. The CESL 24 is subsequently removed from the source/drain regions 22 in preparation for forming a contact in the opened space to each of the source/drain regions 22. The CESL 24 may be removed by an etching process, such as a reactive ion etching (RIE) process, with an etch chemistry that is selective to the semiconductor material constituting the source/drain regions 22. A contact may be formed in each contact opening 30 by, for example, a silicidation process that forms a metal silicide on the source/drain regions 22.

The shape of the sacrificial caps 28 is altered by the self-aligned contact (SAC) etching in that the upper corners are slightly eroded by, for example, sputtering during the etching process forming the contact opening. However, the extent of the erosion is reduced in comparison with conventional self-aligned contact (SAC) etching. Conventional sacrificial caps would be formed in the spaces 26 between the upper sections of the sidewall spacers 20 and the CESL 24 as shown in FIG. 2. Such conventional sacrificial caps, along with the upper sections of the sidewall spacers 20 and the upper sections of the CESL 24, are eroded with a higher erosion rate due at least in part to exposed vertical seams that would exist between the conventional sacrificial cap and the sidewall spacers 20, as well as the exposed vertical seams between the CESL 24 and sidewall spacers 20. In addition, the materials of the sidewall spacers 20 and/or the CESL 24 may have a lower etch resistance than the material of the sacrificial caps 28. The widening of the spaces 26 and the larger-than-conventional sacrificial caps 28 in the widened spaces 26 eliminate the multiple interfaces by masking the vertical seams 27 and present a solid unitary block of material to the SAC etching process, which is effective to significantly reduce corner erosion. The reduction in corner erosion increases the thickness of dielectric material of the sacrificial cap 28 between the contact formed in the contact opening 30 and the gate electrode 18. The reduction in the corner erosion of the sacrificial caps 28 also elevates the starting point relative to the top surface 13 of the gate structures 12 for planarization that removes the sacrificial caps 28 in preparation for forming contacts extending vertically to the gate electrodes 18.

As part of the process of forming the sacrificial caps 28, additional sets of sacrificial caps may be formed and used to facilitate the removal of the sections of the sidewall spacers 20 and the sections of the CESL 24 that are exposed inside the initially-formed spaces 26. The additional sacrificial caps may persist in the completed device structure or may be removed before the sacrificial caps 28 are formed.

Figure 6:
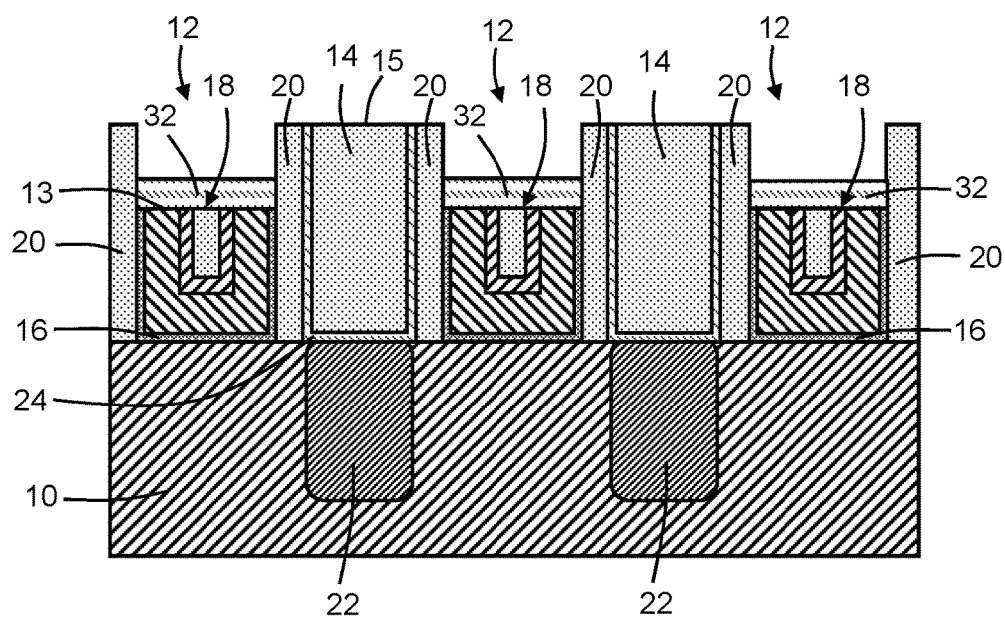
FIGS. 6-7 are cross-sectional views of a portion of a substrate at successive fabrication stages of a processing method for forming a structure in accordance with embodiments of the invention.

With reference to FIG. 6 in which like reference numerals refer to like features in FIG. 2 and in accordance with alternative embodiments of the invention, a sacrificial cap 32 is formed on the respective top surface 13 of each recessed gate structure 12 in the spaces 26 (FIG. 2) before the sections of the sidewall spacers 20 and CESL 24 are removed. The sacrificial caps 32 may be composed of the same material as the subsequently-formed sacrificial caps 28, and have a width that is equal to the width, w1. The sacrificial caps 32 each fill a portion of one of the spaces 26.

Figure 7:
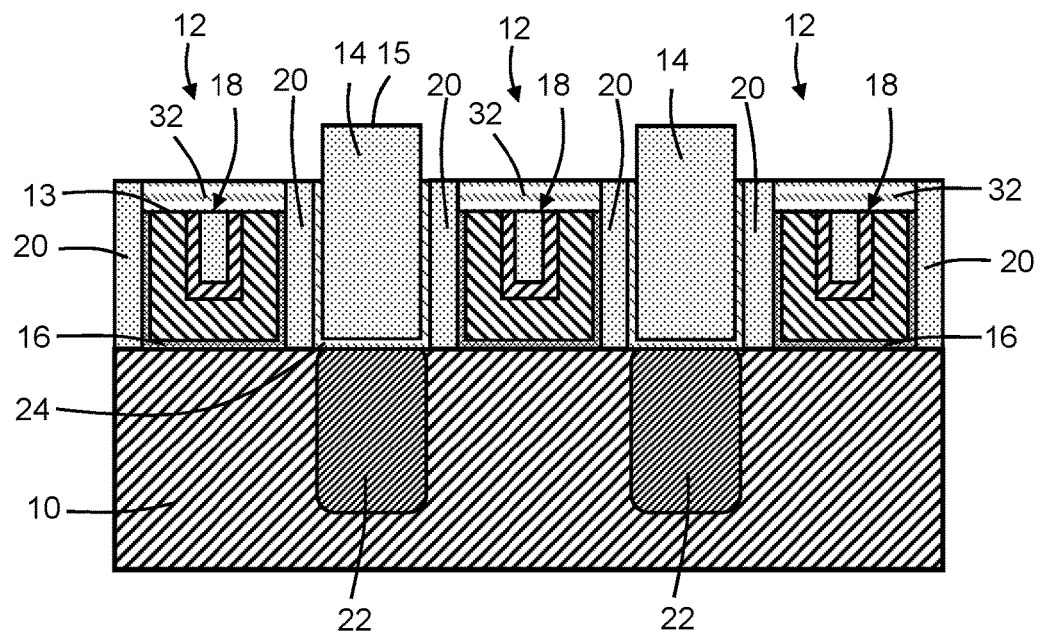

With reference to FIG. 7 in which like reference numerals refer to like features in FIG. 6 and at a subsequent fabrication stage of the processing method, the sections of the sidewall spacers 20 and CESL 24 above the level of the sacrificial caps 32 are removed as described in connection with FIG. 3 in order to widen the spaces 26. The process continues as described in the context of FIGS. 4 and 5 to form the sacrificial caps 28 and to form the contact openings 30 directed to the source/drain regions 22. The sacrificial caps 28 and sacrificial caps 32 will collectively form a T-shaped structure due to the different widths in which the upper sacrificial caps 28 have the width, w2, characteristic of the widened spaces 26 and the lower sacrificial caps 32 have the width, w1, characteristic of the unwidened spaces 26.

Figure 8:
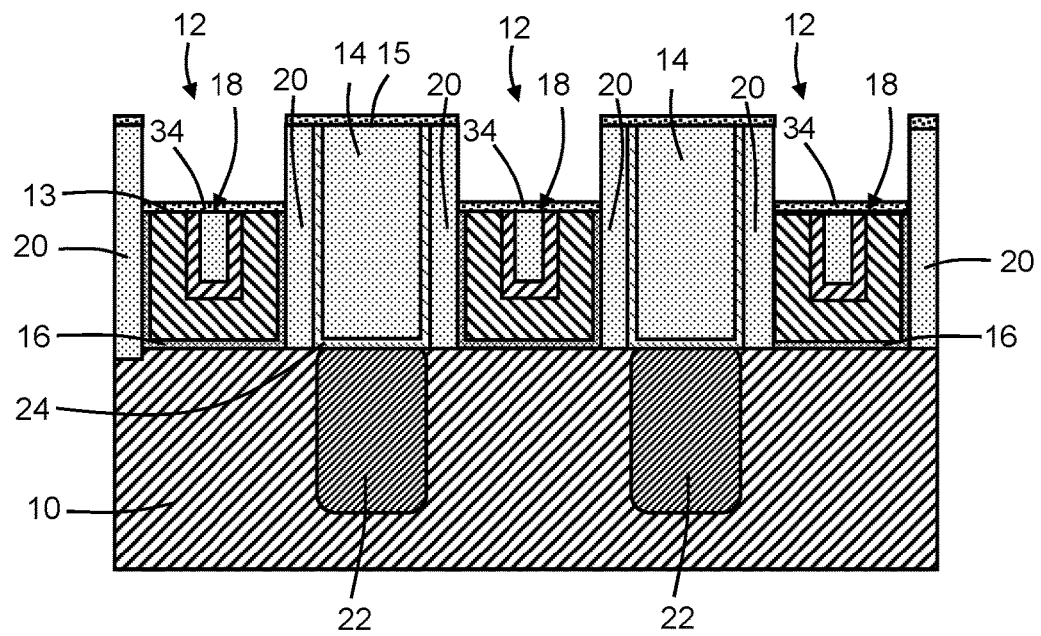
FIGS. 8-10 are cross-sectional views of a portion of a substrate at successive fabrication stages of a processing method for forming a structure in accordance with embodiments of the invention.

With reference to FIG. 8 in which like reference numerals refer to like features in FIG. 2 and in accordance with alternative embodiments of the invention, a sacrificial cap 34 is formed on the respective top surface 13 of each recessed gate structure 12 in the spaces 26 (FIG. 2) before the sections of the sidewall spacers 20 and CESL 24 are removed. The sacrificial caps 34 may be composed of amorphous silicon (Si) deposited by PVD. The sacrificial caps 34 are thinner than the sacrificial caps 32 (FIG. 6).

Figure 9:
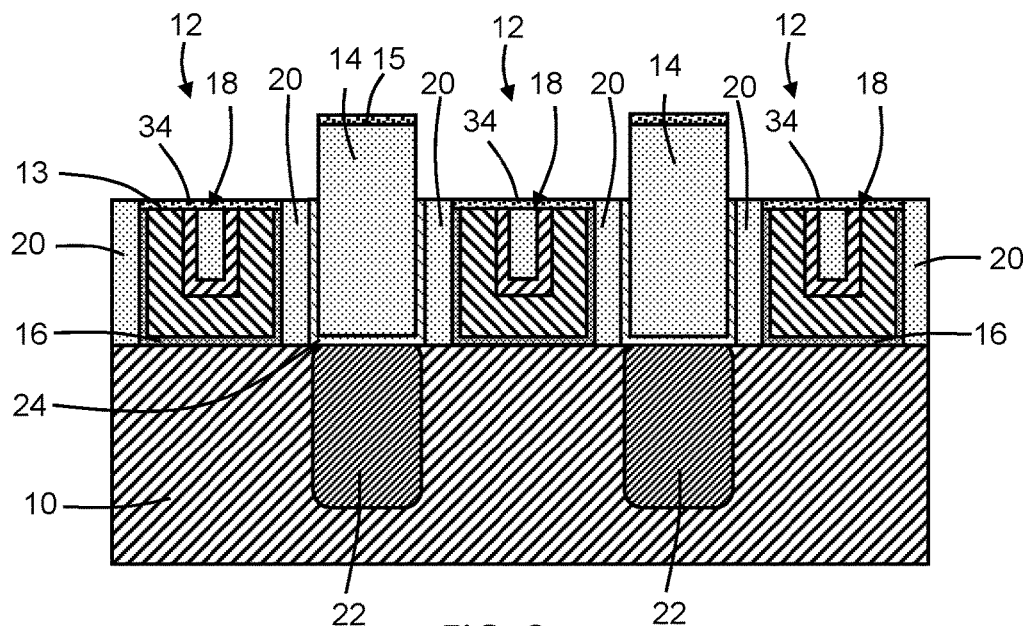

With reference to FIG. 9 in which like reference numerals refer to like features in FIG. 8 and at a subsequent fabrication stage of the processing method, the sections of the sidewall spacers 20 and CESL 24 above the level of the sacrificial caps 34 are removed as described in connection with FIG. 3 in order to widen the spaces 26. In an embodiment, the sections of the sidewall spacers 20 and CESL 24 may be removed by a dry etching process with an etch chemistry that removes the materials of the sidewall spacers 20 and CESL 24 selective to the material constituting the sacrificial caps 34. The reduced thickness of the sacrificial caps 34 in comparison with the sacrificial caps 32 permits the removal of taller sections of the sidewall spacers 20 and CESL 24.

Figure 10:
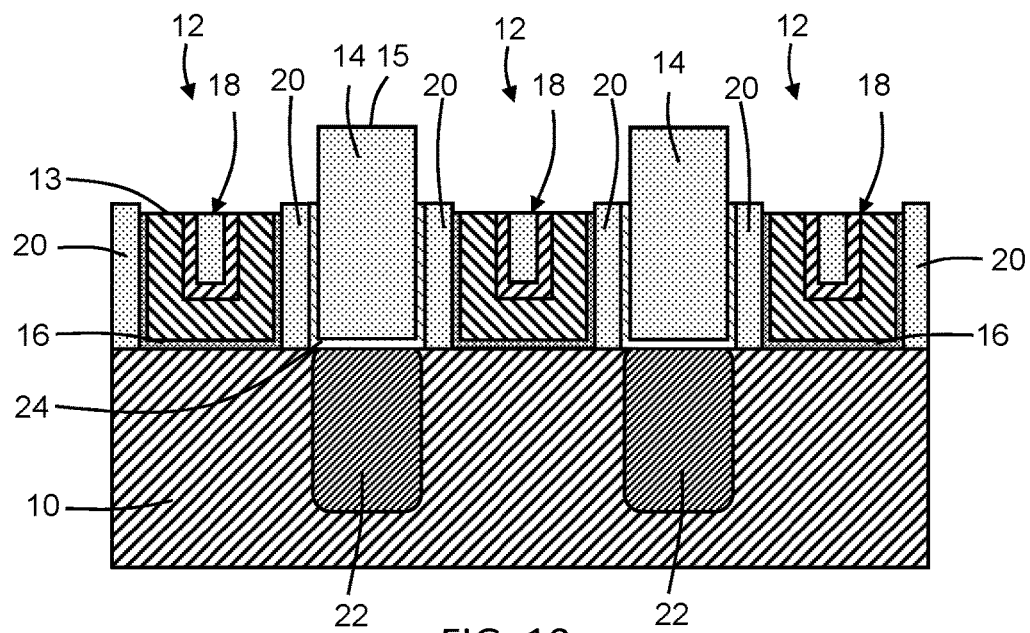

With reference to FIG. 10 in which like reference numerals refer to like features in FIG. 9 and at a subsequent fabrication stage of the processing method, the sacrificial caps 34 are removed after the sections of the sidewall spacers 20 and CESL 24 above the level of the sacrificial caps 34 are removed. In an embodiment, the sacrificial caps 34 may be removed by a dry etching process with an etch chemistry that removes the material constituting the sacrificial caps 34 selective to the materials of the interlayer dielectric layer 14 and the gate electrodes 18.

The process continues as described in the context of FIGS. 4 and 5 to form the sacrificial caps 28 and to form the contact openings 30 directed to the source/drain regions 22. Portions of the sacrificial caps 28 will fill the shallow recesses formed by the removal of the sacrificial caps 34.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first sidewall spacer, a second sidewall spacer, and a gate electrode arranged between the first sidewall spacer and the second sidewall spacer;
   recessing a top surface of the gate electrode to form a recessed gate electrode and open a space above the top surface of the recessed gate electrode that partially exposes the first sidewall spacer and the second sidewall spacer;
   forming a first sacrificial cap in the space over the top surface of the recessed gate electrode; and
   after forming the first sacrificial cap, removing a first section of the first sidewall spacer and a first section of the second sidewall spacer that are arranged above the first sacrificial cap in order to increase a width of the space and form a widened space above the first sacrificial cap.

2. The method of claim 1 further comprising:
   after removing the first section of the first sidewall spacer and the first section of the second sidewall spacer, removing the first sacrificial cap from the gate electrode; and
   after removing the first sacrificial cap, forming a second sacrificial cap in the widened space.

3. The method of claim 2 wherein the first sacrificial cap is composed of amorphous silicon.

4. The method of claim 1 wherein the first sidewall spacer, the second sidewall spacer, and the gate electrode are located between a first section of an etch stop layer and a second section of the etch stop layer, and further comprising:
   after the first section of the first sidewall spacer and the first section of the second sidewall spacer are removed, removing a portion of the first section of the etch stop layer and a portion of the second section of the etch stop layer above the first sacrificial cap.

5. The method of claim 1 further comprising:
   before the gate electrode is recessed, planarizing the gate electrode, the first sidewall spacer, and the second sidewall spacer to be coplanar with a top surface of an interlayer dielectric layer.

6. The method of claim 5 wherein the gate electrode is located between a first section of the interlayer dielectric layer and a second section of the interlayer dielectric layer, and the widened space extends from the first section of the interlayer dielectric layer to the second section of the interlayer dielectric layer.

7. The method of claim 5 wherein a second section of the first sidewall spacer is located between a section of an interlayer dielectric layer and the recessed gate electrode, and the first section of the first sidewall spacer extends from the top surface of the recessed gate electrode to the top surface of the section of the interlayer dielectric layer.

8. The method of claim 1 further comprising:
   forming a second sacrificial cap in the widened space.

9. The method of claim 8 wherein the second sacrificial cap is formed on the first sacrificial cap, and the first sacrificial cap is arranged between the second sacrificial cap and the top surface of the recessed gate electrode.

10. The method of claim 9 wherein a second section of the first sidewall spacer and a second section of the second sidewall spacer are located below the top surface of the recessed gate electrode, and the first sacrificial cap extends from the second section of the first sidewall spacer to the second section of the second sidewall spacer.

11. The method of claim 9 wherein the first sacrificial cap and the second sacrificial cap are composed of the same dielectric material.

12. The method of claim 9 wherein the first sacrificial cap and the second sacrificial cap are composed of silicon nitride.

13. The method of claim 8 wherein the recessed gate electrode is arranged between a second section of the first sidewall spacer and a second section of the second sidewall spacer, and the second sacrificial cap overlaps with the second section of the first sidewall spacer and with the second section of the second sidewall spacer.

14. The method of claim 8 wherein the recessed gate electrode is arranged between a second section of the first sidewall spacer and a second section of the second sidewall spacer, the first sacrificial cap directly contacts the top surface of the recessed gate electrode, and the second sacrificial cap overlaps with the second section of the first sidewall spacer and with the second section of the second sidewall spacer.

15. The method of claim 8 wherein a second section of the first sidewall spacer is located between a section of an interlayer dielectric layer and the recessed gate electrode, and further comprising:
   after the second sacrificial cap is formed, removing the section of the interlayer dielectric layer to form a contact opening.

16. The method of claim 15 wherein a gate dielectric is located between the gate electrode and the second section of the first sidewall spacer, and the second sacrificial cap masks a seam at a vertical interface between the second section of the first sidewall spacer and the gate dielectric when the section of the interlayer dielectric layer is removed to form the contact opening.

17. The method of claim 15 wherein an etch stop layer is located between the section of the interlayer dielectric layer and the second section of the first sidewall spacer, and the second sacrificial cap masks a seam at a vertical interface between the second section of the first sidewall spacer and the etch stop layer when the section of the interlayer dielectric layer is removed to form the contact opening.

18. The method of claim 15 wherein the contact opening extends to a source/drain region of a field-effect transistor.

19. The method of claim 8 wherein the second sacrificial cap is free of internal voids.

* * * * *